United States Patent
Aihara (10) Patent No.: US 11,876,061 B2
(45) Date of Patent: Jan. 16, 2024

(54) SEMICONDUCTOR DEVICE INCLUDING BOND PAD WITH FIXING PARTS FIXED ONTO INSULATING FILM

(71) Applicant: Mitsubishi Electric Corporation, Tokyo (JP)

(72) Inventor: Yasuki Aihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 213 days.

(21) Appl. No.: 17/420,586

(22) PCT Filed: Mar. 6, 2019

(86) PCT No.: PCT/JP2019/008748
§ 371 (c)(1),
(2) Date: Jul. 2, 2021

(87) PCT Pub. No.: WO2020/178995
PCT Pub. Date: Sep. 10, 2020

(65) Prior Publication Data
US 2022/0093544 A1    Mar. 24, 2022

(51) Int. Cl.
*H01L 23/00*    (2006.01)

(52) U.S. Cl.
CPC .............. *H01L 24/05* (2013.01); *H01L 24/03* (2013.01); *H01L 24/04* (2013.01); *H01L 24/48* (2013.01);
(Continued)

(58) Field of Classification Search
CPC ......... H01L 24/05; H01L 24/03; H01L 24/04; H01L 24/48; H01L 2224/03005;
(Continued)

(56) References Cited

U.S. PATENT DOCUMENTS 10,297,561 B1 * 5/2019 Mayer ..................... H01L 24/03
11,387,155 B2 * 7/2022 Nangia ................... H01L 24/14
(Continued)

FOREIGN PATENT DOCUMENTS

CN      115188733 A  * 10/2022
JP      S61-116848 A    6/1986
(Continued)

OTHER PUBLICATIONS

International Search Report issued in PCT/JP2019/008748; dated Apr. 16, 2019.

*Primary Examiner* — Douglas W Owens
(74) *Attorney, Agent, or Firm* — Studebaker & Brackett PC (57) ABSTRACT

Provided here are: an electrically-conductive semiconductor substrate with which a semiconductor circuit is formed; an insulating film deposited on a major surface of the electrically-conductive semi-conductor substrate; and a bonding pad having fixing parts fixed onto the insulating film, side wall parts rising up from the fixing parts, and an electrode part connected to the side wall parts and disposed in parallel to the major surface; wherein the electrode part forms, together with the insulating film, a gap region therebetween, and portions of the electrode part where it is connected to the side wall parts are configured to have at least one of: a positional relationship in which they sandwich therebetween a central portion of the electrode part in its bonding region to be bonded to a bonding wire; and a positional relationship in which they surround the central portion.

6 Claims, 4 Drawing Sheets

(52) U.S. Cl.
CPC ............... *H01L 2224/03005* (2013.01); *H01L 2224/039* (2013.01); *H01L 2224/03462* (2013.01); *H01L 2224/03466* (2013.01); *H01L 2224/03632* (2013.01); *H01L 2224/04042* (2013.01); *H01L 2224/05016* (2013.01); *H01L 2224/05073* (2013.01); *H01L 2224/05166* (2013.01); *H01L 2224/05551* (2013.01); *H01L 2224/05552* (2013.01); *H01L 2224/05555* (2013.01); *H01L 2224/05556* (2013.01); *H01L 2224/05573* (2013.01); *H01L 2224/05644* (2013.01); *H01L 2224/48453* (2013.01); *H01L 2224/48463* (2013.01); *H01L 2924/10335* (2013.01); *H01L 2924/30105* (2013.01)

(58) Field of Classification Search
CPC . H01L 2224/03462; H01L 2224/03466; H01L 2224/03632; H01L 2224/039; H01L 2224/04042; H01L 2224/05016; H01L 2224/05073; H01L 2224/05166; H01L 2224/05551; H01L 2224/05552; H01L 2224/05555; H01L 2224/05556; H01L 2224/05573; H01L 2224/05644; H01L 2224/48453; H01L 2224/48463; H01L 2924/10335; H01L 2924/30105; H01L 24/85; H01L 2224/03418; H01L 2224/0347; H01L 2224/05144; H01L 2224/05557; H01L 24/45; H01L 2224/45015; H01L 2224/45144; H01L 2224/85365

See application file for complete search history.

(56) References Cited

U.S. PATENT DOCUMENTS

| | | | | |
|---|---|---|---|---|
| 2009/0224382 | A1* | 9/2009 | Goller | H01L 23/49548 257/676 |
| 2014/0103532 | A1* | 4/2014 | Huang | H01L 21/76834 257/773 |
| 2023/0005881 | A1* | 1/2023 | Poddar | H01L 23/49816 |

FOREIGN PATENT DOCUMENTS

| | | |
|---|---|---|
| JP | H07-079011 A | 3/1995 |
| JP | 2010-258342 A | 11/2010 |
| JP | 2012-142498 A | 7/2012 |

* cited by examiner

SEMICONDUCTOR DEVICE INCLUDING BOND PAD WITH FIXING PARTS FIXED ONTO INSULATING FILM

TECHNICAL FIELD

The present application relates to a semiconductor device.

BACKGROUND ART

Such semiconductor devices are disclosed in which, in order to reduce influences due to the fact that bonding pads as electrodes in the semiconductor devices have parasitic capacitances, gaps are created between the electrodes and their substrates (see, for example, Patent Documents 1 to 3). However, in the semiconductor device described in Patent Document 1, the electrode is placed away from the substrate in a cantilever manner, and in Patent Document 2, the electrode is configured to be elastically deformed.

Thus, the interval between the electrode and the substrate is not provided stably, so that it is assumed that, even though the parasitic capacitance could be reduced, an influence by its variation becomes significant.

CITATION LIST

Patent Document

Patent Document 1: Japanese Patent Application Laid-open No. S61-116848 (Page 2, Upper-Right Column to Page 3, Upper-Right Column; FIG. 1 to FIG. 3)

Patent Document 2: Japanese Patent Application Laid-open No. 2010-258342 (Paragraphs 0015 to 0021; FIG. 1 to FIG. 5, FIG. 8 to FIG. 9)

Patent Document 3: Japanese Patent Application Laid-open No. H07-79011 (Paragraphs 0039 to 0041; FIG. 8)

SUMMARY OF THE INVENTION

Problems to be Solved by the Invention

To deal with that problem, as in the semiconductor device described, for example, in Patent Document 3, it is conceivable to place a polyimide tube between the electrode and the substrate to thereby mechanically achieve stability; however, because the specific dielectric constant of the polyimide is 3, it cannot be said that the parasitic capacitance can be reduced sufficiently. Namely, it is difficult to reduce the parasitic capacitance and to establish stability thereof, concurrently.

This application discloses a technique for solving such a problem described above, and an object thereof is to provide a semiconductor device which can stably reduce the parasitic capacitance.

Means for Solving the Problems

A semiconductor device disclosed in this application is characterized by comprising: an electrically-conductive semiconductor substrate with which a semiconductor circuit is formed; an insulating film deposited on a major surface of the electrically-conductive semiconductor substrate; and a bonding pad having fixing parts fixed onto the insulating film, side wall parts rising up from the fixing parts, and an electrode part connected to the side wall parts and disposed in parallel to the major surface; wherein the electrode part forms, together with the insulating film, a gap region therebetween, and portions of the electrode part where it is connected to the side wall parts are in at least one of: a positional relationship in which they sandwich therebetween a central portion of the electrode part in its bonding region to be bonded to a bonding wire; and a positional relationship in which they surround the central portion, and wherein the bonding pad has: an open portion created in the electrode part and inside the bonding region; a secondary fixing part that is a portion directed in parallel to the major surface and matched to the open portion, and that is fixed onto the insulating film; and a cylindrical secondary side wall part rising up from the secondary fixing part; wherein an inner circumference portion around the open portion is connected to the secondary side wall part.

EFFECT OF THE INVENTION

According to the semiconductor device disclosed in this application, the side wall parts are disposed on the outer circumference side of an electrode to thereby create a gap. Thus, it is possible to provide a semiconductor device which can stably reduce the parasitic capacitance.

MODES FOR CARRYING OUT THE INVENTION

Embodiment 1

Figure 1A:
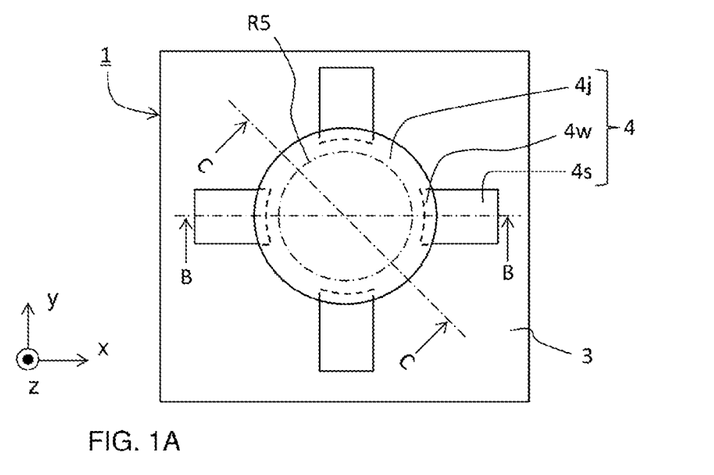
FIG. 1A to FIG. 1C are a plan view and sectional end views perpendicular to the plan view and taken in different cutting directions, respectively, of a semiconductor device according to Embodiment 1.
Figure 1B:
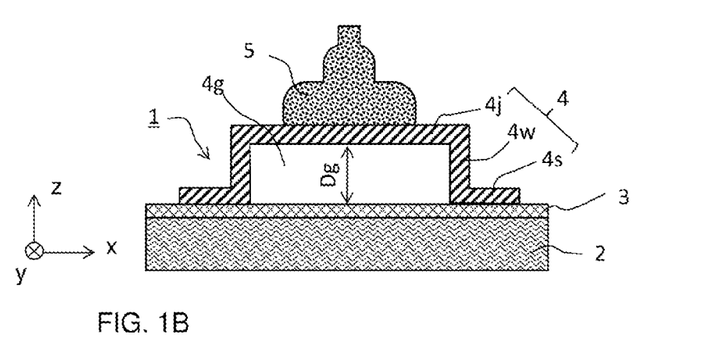

FIG. 1A, FIG. 1B and FIG. 2A to FIG. 2F serve for explaining a configuration of a semiconductor device according to Embodiment 1 and a manufacturing method thereof, in which FIG. 1A, FIG. 1B shows a plan view (FIG. 1A) of a region of the semiconductor device where one bonding pad is formed; and further, a sectional end view (FIG. 1B) cut along a B-B line in FIG. 1A and a sectional end view (FIG. 1C) cut along a C-C line in FIG. 1A, each as a sectional end view perpendicular to the plan view and in a state in which a bonding wire is added. Further, FIG. 2A to FIG. 2F are sectional end views corresponding to FIG. 1B, each showing a state at each of steps in a process of forming the bonding pad on an electrically-conductive semiconductor substrate for constituting the semiconductor device. Note that, herein and also in subsequent Embodiments, directions are indicated in each figure so that a plane that is parallel to a major surface of the semiconductor device is provided as an xy plane, and a thickness direction thereof is provided as a z-direction.

The semiconductor device according to each of Embodiments in this application is that in which an active element including a semiconductor element such as a switching element, a rectifier element or the like, is formed, optionally with a passive element such as a resistance element, a capacitor or the like, on an electrically-conductive substrate, to thereby constitute a semiconductor circuit. In this respect, bonding pads, which are each a characterizing portion in this application, are electrically connected to the element(s) that constitute the aforementioned semiconductor circuit through a wiring pattern formed on an insulating film covering the surface of the electrically-conductive semiconductor substrate, and serve to make electrical connection to the outside by wire bonding. However, in this application, only a region where one bonding pad is joined onto the insulating film covering the electrically-conductive semiconductor substrate is illustrated. Thus, description will be made without illustration of the other region including connection portions between the bonding pads and the wiring pattern.

Figure 1C:
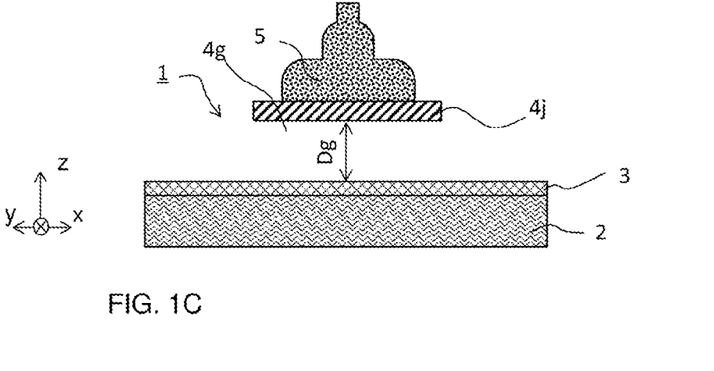

As shown in FIG. 1A to FIG. 1C, a semiconductor device 1 is that in which an insulating film 3 is deposited on an electrically-conductive semiconductor substrate 2, and a bonding pad 4 made of metal is formed on the insulating film 3. The bonding pad 4 includes: an electrode part 4j to be bonded with a bonding wire 5 by wire bonding, namely, to be provided as an electrode; and fixing parts 4s whose end portion is electrically connected to an unshown wiring pattern and which are fixed onto the insulating film 3.

The electrode part 4j and the fixing parts 4s each spread in parallel to the major surface of the electrically-conductive semiconductor substrate 2 so as to fully occupy a specified area in the xy plane. Further, in the bonding pad 4 of the semiconductor device 1 according to Embodiment 1, the electrode part 4j is connected, through side wall parts 4w extending in the thickness direction (z-direction), to the fixing parts 4s extending in the xy plane in a direction away from the electrode part 4j. Specifically, the electrode part 4j has, in the xy plane, a size enclosing a bonding region R5 for bonding the bonding wire 5, and a set of the side wall parts 4w and a set of the fixing parts 4s are located outside the bonding region R5, each as four parts separated along the circumferential direction.

Accordingly, a gap region 4g with an interval Dg is formed between the electrode part 4j and the insulating film 3 so as to encompass the area of the bonding region R5 directed in the xy plane. In this state, the central portion in the bonding region R5 of the electrode part 4j is supported in a manner sandwiched by at least two side wall parts 4w among the four side wall parts 4w, and at the same time, the gap region 4g is communicated with the outside at its portions in the circumferential direction other than those where the side wall parts 4w are provided.

Next, the manufacturing method will be described using FIG. 2A to FIG. 2F. Here, as described above, FIG. 2A to FIG. 2F each show a sectional end view corresponding to FIG. 1B, so that a partial state corresponding to FIG. 1C in which the side wall parts 4w and the fixing parts 4s along the circumferential direction are not placed, and a resist, etc. for achieving that state, are omitted from illustration.

Figures 2A, 2B:
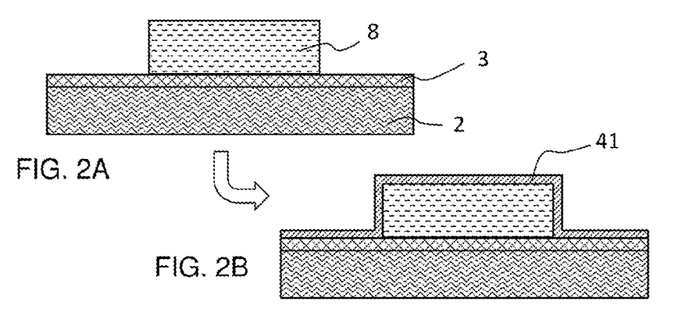
FIG. 2A to FIG. 2F are sectional end views each showing a state at each of steps in a manufacturing process of the semiconductor device according to Embodiment 1.

First, as shown in FIG. 2A, the insulating film 3 is deposited on the electrically-conductive semi-conductor substrate 2 with which the elements, etc. for constituting an unshown semiconductor circuit are formed, and a first photoresist 8 is then formed on a portion of the insulating film 3 where the gap region 4g is to be formed. Then, as shown in FIG. 2B, a power feeding layer 41 made of metal is deposited over the surface of a convex shape formed of the first photoresist 8 and the exposed portion of the insulating film 3. On an outside edge portion of the thus-deposited power feeding layer 41, a second photoresist 9 is formed as shown in FIG. 2C.

Figures 2C, 2D, 2E, 2F:
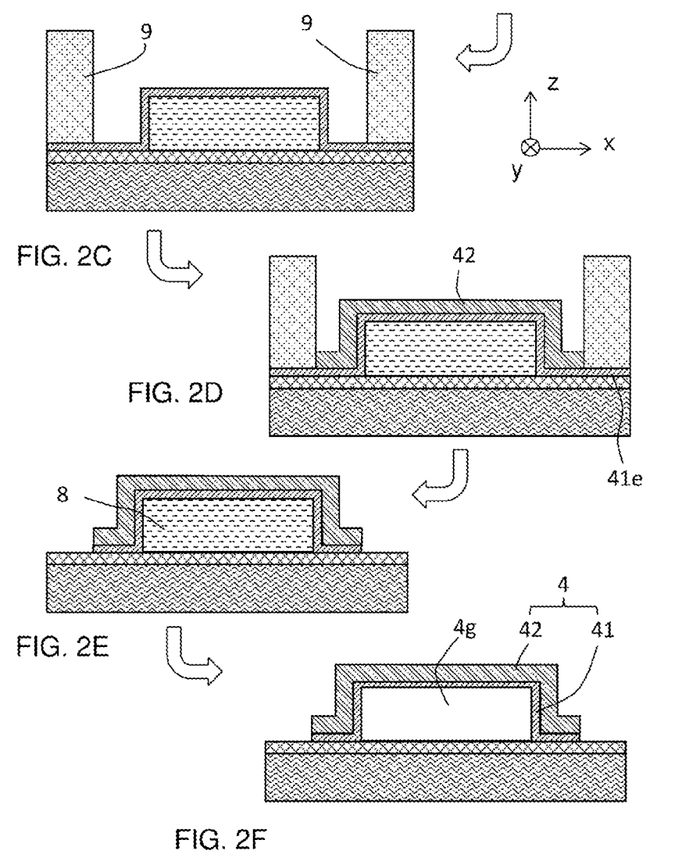

Then, as shown in FIG. 2D, on a portion of the power feeding layer 41 exposed from the second photoresist 9, a plated layer 42 is formed by an electrolytic plating method. Thereafter, the second photoresist 9 is removed using an organic solvent and then, as shown in FIG. 2E, a portion 41e of the power feeding layer 41 that was covered with the second photoresist 9 is removed using an ion milling method. Lastly, using an organic solvent, the first photoresist is removed through part-lacking regions shown in FIG. 1C where the side wall parts 4w in the circumferential direction are not formed. As the result, the bonding pad 4 as shown in FIG. 2F is formed which has a two-layer structure of the power feeding layer 41 and the plated layer 42, and has the gap region 4g between itself and the insulating film 3.

It is noted that, in Embodiment 1 and subsequent Embodiments, an n-type InP substrate is used as the electrically-conductive semiconductor substate 2; $SiO_2$ is used for the insulating film 3; a Ti—Au (titanium-gold) stacked structure is applied to the power feeding layer 41 for constituting the bonding pad 4; and Au (gold) is used for the plated layer 42 for constituting the same. This makes it possible to easily achieve the semiconductor device 1 having the bonding pad 4 with the structure described according to FIG. 1, by using the manufacturing method described according to FIG. 2. Meanwhile, among layers of the same type of metal, the layer formed by deposition such as vapor deposition, sputtering or the like, generally becomes, when it is a part such as the side wall part 4w extending in a direction perpendicular to the plane (z-direction), smaller in thickness and also lower in density, than when it is a part such as the fixing part 4s or the electrode part 4j formed in parallel to the plane. However, in the plated layer 42 formed by electrolytic plating, a portion corresponding to the side wall part 4w has a thickness and a density that are equivalent to those of portions corresponding to the fixing part 4s and the electrode part 4j, so that the strength of the side wall part 4w is increased and thus the deformation resistance to be described later is improved.

Next, functions and effects according to this application will be described. Examples of the factor of increasing the parasitic capacitance of a bonding pad in the semiconductor device, include a parallel-plate capacitance formed by the semiconductor substrate and the bonding pad through the insulating film. This capacitance is proportional to the dielectric constant of the insulating film and the area of the parallel plate, and is inversely proportional to the thickness of the insulating film.

Of these, the dielectric constant and the thickness of the insulating film are determined by the property of the insulating film and the fabrication method thereof. For example, in the case of $SiO_2$ formed by a plasma CVD method, the specific dielectric constant is about 4, and the upper limit of the thickness is determined based on the fact that, in consideration of productivity and workability, the thickness has to be several micrometers or less. With respect to the area (electrode part), the smaller it is, the smaller the parasitic capacitance is; however, it can only be reduced up to a diameter of about 50 μm in the case where ball bonding is to be performed using a bonding wire of Au.

The parallel-plate capacitance is dominantly determined by an area where the metal portion of the bonding pad and the insulating film are in contact with each other. Thus, by employing the structure having the gap region 4g between the bonding pad 4 and the insulating film 3 as in this application, it becomes possible to reduce the parasitic capacitance, as compared with a structure in which the bonding pad is fully in contact with the insulating film.

In this state, the central portion in the bonding region R5 of the electrode part 4j being not in contact with the insulating film 3, is supported from its outer circumference side so as to be surrounded by the four side wall parts 4w. Thus, it is possible to keep the electrode part 4j undeformed in the thickness direction, against a force applied at the time of wire bonding to press the electrode part 4j in the thickness direction (z-direction) toward the electrically-conductive semi-conductor substrate 2. At that time, even if a force directed in parallel to the xy plane is applied, it is possible to keep the electrode part 4j undeformed in either the x-direction or the y-direction.

Further, since the side wall parts 4w that support the electrode part 4j are made of metal, they are prevented from being eroded at the time the first photoresist 8 for forming the gap region 4g is removed. Furthermore, since the thickness of the photoresist can be controlled accurately, the accuracy of the interval Dg is high. In that regard, for example, in a modified example in Patent Document 2, such a configuration is described in which an electrode part is lifted using a frame-shaped insulating film. However, the insulating film is poor in dimensional controllability because its thickness may vary depending on the deposition/disposal time or speed. It is noted, however, that, in Patent Document 2, it is not necessary to consider such a problem because the electrode is originally assumed to be elastically deformed. However, in the case where accuracy and stability of the interval are required, dimensional variation may cause a significant problem.

It is noted that in Embodiment 1, a case has been described where four side wall parts 4w are provided along the circumferential direction; however, this is not limitative, and the number may be more than four. Instead, three side wall parts may be disposed along the circumferential direction so that the central portion is surrounded by three locations of them, or two side wall parts may be disposed so that the central portion is sandwiched between two locations of them. For example, if, out of the four sets of side wall parts 4w and fixing parts 4s in FIG. 1A, there are only two sets located in the directions of three o'clock and nine o'clock, the central portion of the electrode part 4j is still sandwiched by the two side wall parts 4w. Thus, even if the electrode part 4j is pressed in the thickness direction, the electrode part 4j is prevented from being deformed in the thickness direction, so that it is possible to hold the shape of the gap region 4g (in particular, the interval Dg) formed between the electrode part 4j and the insulating layer 3.

Furthermore, the side wall parts 4w located in a direction (x-direction) in which the electrode part 4j is sandwiched therebetween, each have a width in a direction (y-direction) perpendicular to the above direction that fully occupies one-third or more of the width of the bonding region R5 so as to cover the central portion of the electrode part 4j. Thus, even if the electrode part 4j is subjected to a force directed in parallel thereto (x-direction or y-direction), the electrode part 4j is prevented from being deformed in the y-direction as well as in the x-direction, so that it is possible to hold the shape of the gap region 4g (in particular, the interval Dg) formed between the electrode part 4j and the insulating layer 3.

Embodiment 2

Figure 3A:
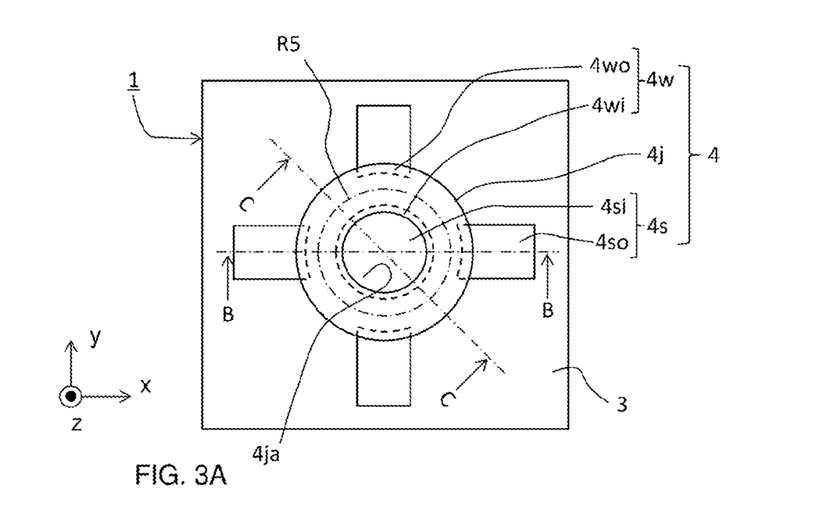
FIG. 3A to FIG. 3C are a plan view and sectional end views perpendicular to the plan view and taken in different cutting directions, respectively, of a semiconductor device according to Embodiment 2.
Figure 3B:
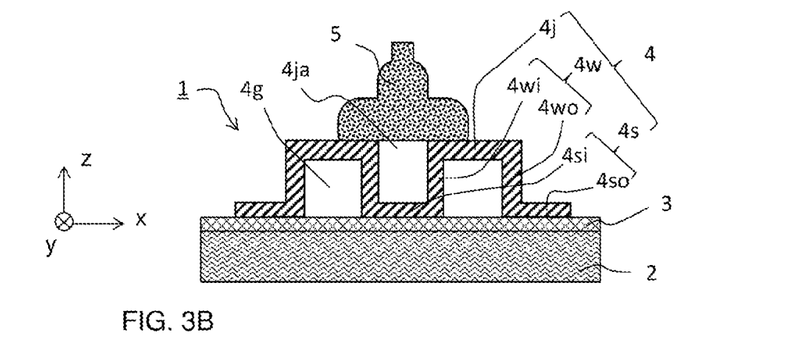
Figure 3C:
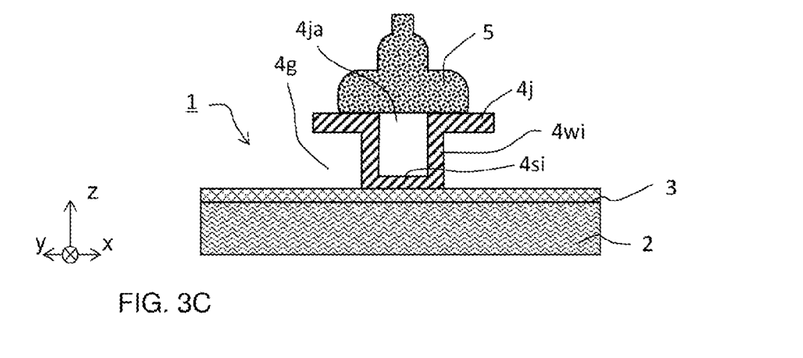

In Embodiment 1, a case has been described where the side wall parts are provided only at the outer circumference portion of the electrode part. In Embodiment 2, a case will be described where another side wall part is additionally provided on an inner circumference side of the electrode part. FIG. 3A to FIG. 3C shows a plan view (FIG. 3A) of a region of the semiconductor device according to Embodiment 2 where one bonding pad is formed; and further, a sectional end view (FIG. 3B) cut along a B-B line in FIG. 3A and a sectional end view (FIG. 3C) cut along a C-C line in FIG. 3A, each as a sectional end view perpendicular to the plan view and in a state in which a bonding wire is added.

It is noted that, with respect to the semiconductor device according to Embodiment 2 or Embodiment 3 to be described later, the configuration and the manufacturing method thereof other than the bonding pad portion are same as those described in Embodiment 1, so that, for the same components, description thereof will be omitted.

In a semiconductor device 1 according to Embodiment 2, as shown in FIG. 3A to FIG. 3C, the electrode part 4j of the bonding pad 4 forms an annular shape having an open portion 4ja, and the side wall parts 4w and the fixing parts 4s are provided not only on the outer circumference side but also on the inner circumference side. With respect to the outer circumference side, the configuration is the same as that of the portions in Embodiment 1 symbolized as the side wall parts 4w and the fixing parts 4s, so that detailed description thereof will be omitted; however, in Embodiment 2, a mark "o" indicative of the outer circumference side is affixed to the ends of the corresponding parts, so that they are indicated as side wall parts 4wo and fixing parts 4so.

Although the electrode part 4j spreads in parallel to the major surface of the electrically-conductive semiconductor substrate 2 so as to fully occupy a specified area in the xy plane and has a size enclosing the bonding region R5, it is formed into an annular shape having, at its central portion, the open portion 4ja whose diameter is smaller than that of the bonding region R5. The configuration on the outer circumference side of the annular shape is the same as in Embodiment 1 as described above; however, a cylindrical side wall part 4wi to be referred to as a second side wall part is connected to the inner circumference side thereof. The cylindrical side wall part 4wi extends in the thickness direction (z-direction) toward the insulating film 3, forms a circle matched with the open portion 4ja, and is connected to a fixing part 4si to be referred to as a second fixing part, tightly fixed onto the insulating film 3.

Accordingly, within the zone between the electrode part 4j and the insulating film 3, in an annular zone that is surrounded by the side wall parts 4wo placed on the outer circumference side and the side wall part 4wi placed on the inner circumference side, a gap region 4g with an interval Dg is formed. The portion as the fixing part 4si on the inner circumference side serves as a parallel plate and thus, as compared with Embodiment 1, the effect of reducing the parasitic capacitance decreases. However, even when the diameter of the fixing part 4si is set, for example, at about one-third the outer diameter of the electrode part 4j, the area where the parallel plate is formed is at most about ten percent of the area of the electrode part 4j, so that it is thought that, basically, the parasitic capacitance can be reduced similarly to Embodiment 1.

At the same time, the electrode part 4j is supported not only by the side wall parts 4w on the outer circumference side described in Embodiment 1, but also by the cylindrical side wall part 4wi on the inner circumference side, as a secondary side wall part. Thus, because of being supported by the side wall part 4wi on the inner circumference side in addition to the outside side wall parts 4wo, the electrode part 4*j* is more surely suppressed from being deformed in the thickness direction, so that it is possible to hold the shape of the gap region 4*g* formed between the electrode part 4*j* and the insulating layer 3. In particular, at the time of wire bonding, the side wall part 4*wi* on the inner circumference side acts directly against the pressing force in the thickness direction, not through the electrode part 4*j* serving as a beam, so that it is possible to more strongly prevent the deformation.

Further, with respect to a force directed in parallel to the electrode part 4*j*, the electrode part 4*j* is prevented from being deformed by its y-direction component as well as its x-direction component, because of the addition of the side wall part 4*wi* on the inner circumference side, so that it is possible to more strongly hold the shape of the gap region 4*g* formed between the electrode part 4*j* and the insulating layer 3. In particular, the side wall part 4*wi* on the inner circumference side is cylindrical, so that, from the structural viewpoint, it is highly effective for suppressing the deformation with respect to every direction in the xy plane.

Embodiment 3

Figure 4A:
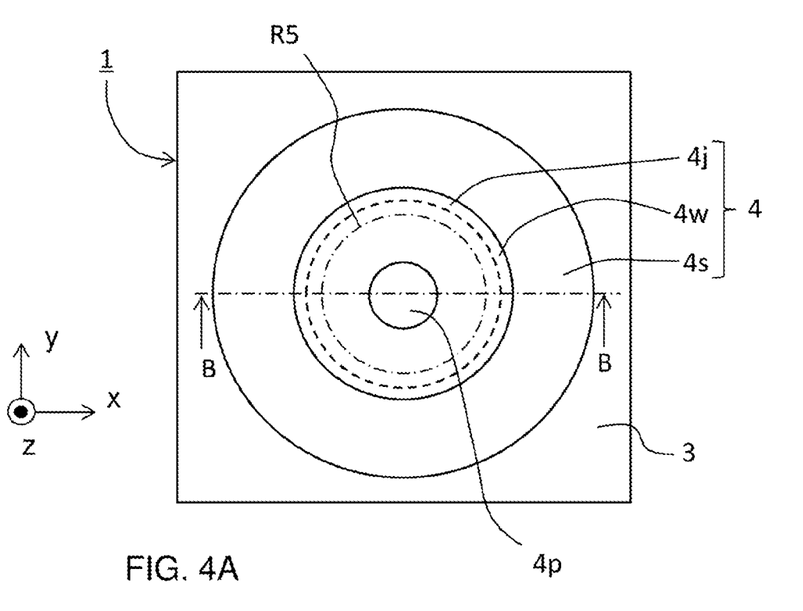
FIG. 4A and FIG. 4B are a plan view and a sectional end view perpendicular to the plan view, respectively, of a semiconductor device according to Embodiment 3.
Figure 4B:
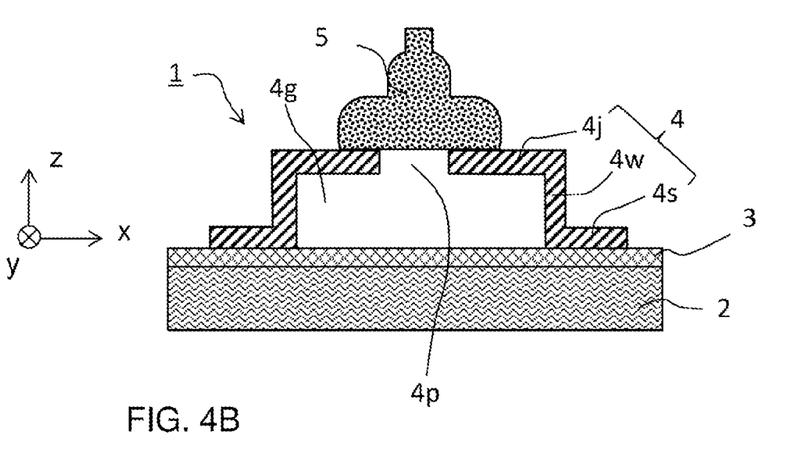

In Embodiment 1 or 2, a case has been described where the side wall parts on the outer circumference side of the electrode part are located separately along the circumferential direction. In Embodiment 3, a case will be described where the side wall parts on the outer circumference side are configured continuously along the circumferential direction, and at the same time, a communication hole communicated between the gap region and the outside is created in the electrode part. FIG. 4A and FIG. 4B shows a plan view (FIG. 4A) of a region of the semiconductor device according to Embodiment 3 where one bonding pad is formed, and further, a sectional end view (FIG. 4B) cut along a B-B line in FIG. 4A, as a sectional end view perpendicular to the plan view and in a state in which a bonding wire is added.

In a semiconductor device 1 according to Embodiment 3, as shown in FIG. 4A and FIG. 4B, the side wall parts and the fixing parts described in Embodiment are configured to form a cylindrical shape and an annular shape, respectively, in which they are continued together in the circumferential direction. In that case, the part-lacking regions for removing the first photoresist 8, described using FIG. 2E and FIG. 2F in Embodiment 1, are absent on the outer circumference side of the first photoresist 8. Thus, a communication hole 4*p* is created in the electrode part 4*j*.

Although the electrode part 4*j* spreads in parallel to the major surface of the electrically-conductive semiconductor substrate 2 so as to fully occupy a specified area in the xy plane and has a size enclosing the bonding region R5, the communication hole 4*p* whose diameter is smaller than that of the bonding region R5, is created at the central portion in that region.

With such a configuration, the electrode part 4*j* is supported by the side wall parts 4*w* along the entire circumference thereof. Thus, it is possible to restrain the deflection of the electrode part 4*j* and thus to suppress the deformation thereof in the thickness direction, more surely than the configuration shown in Embodiment 1 in which the electrode part is supported intermittently, to thereby hold the shape of the gap region 4*g* formed between the electrode part 4*j* and the insulating layer 3. In particular, the side wall parts 4*w* are formed into a cylindrical shape, so that, from the structural viewpoint, they are highly effective for suppressing the deformation with respect to every direction in the xy plane. Further, since the gap region 4*g* covers an area similar to that in Embodiment 1, a similar effect of reducing the parasitic capacitance can be achieved.

It is noted that the communication hole 4*p* is not necessarily required to fall within the central portion or the bonding region R5, and may be created at any position in the electrode part 4*j* so long as the sacrifice layer (first photoresist 8) can be removed therethrough. Instead, it may be created partially in the side wall part 4*w* so far as it does not impair the support of the electrode part 4*j*.

In another aspect, when, as exemplified here, the communication hole 4*p* is created within the bonding region R5 and at the position where it is to be closed by bonding, the gap region 4*g* after bonding is provided as a closed space. In this case, even when the major surface of the semiconductor device 1 is sealed, for example, with a resin, the resin for sealing does not intrude into the gap region 4*g*, so that the effect of reducing the parasitic capacitance is prevented from being degraded due to an increase in dielectric constant.

Further, in each of foregoing Embodiments, a case has been described where an n-type InP substrate is used as the electrically-conductive semiconductor substate 2; $SiO_2$ is used for the insulating film 3; a Ti—Au stacked structure is applied to the power feeding layer 41 for constituting the bonding pad 4; and Au (gold) is used for the plated layer 42 for constituting the same; however, this is not limitative. Furthermore, although the bonding pad 4 is exemplified by that formed of a stacked structure, this is not limitative, and it suffices that the bonding pad is just capable of electrically connecting, by wire bonding, the element for constituting the semiconductor circuit and an external circuit to each other. Concurrently, it suffices that the gap region 4*g* is formed between the electrode part 4*j* and the insulating film 3 by means of the side wall parts 4*w* that sandwich the central portion in the bonding region R5 therebetween or surround the central portion in the bonding region R5.

Furthermore, in this application, a variety of exemplary embodiments and examples are described;

however, every characteristic, configuration or function that is described in one or more embodiments, is not limited to being applied to a specific embodiment, and may be applied singularly or in any of various combinations thereof to another embodiment. Accordingly, an infinite number of modified examples that are not exemplified here are supposed within the technical scope disclosed in the present description. For example, such cases shall be included where at least one configuration element is modified; where any configuration element is added or omitted; and furthermore, where at least one configuration element is extracted and combined with a configuration element of another embodiment.

As described above, the semiconductor device according to each of Embodiments is configured to comprise: the electrically-conductive semiconductor substrate 2 with which a semiconductor circuit is formed; the insulating film 3 deposited on the major surface of the electrically-conductive semiconductor substrate 2; and the bonding pad 4 having the fixing parts 4*s* (or fixing parts 4*so*) fixed onto the insulating film 3, the side wall parts 4*w* (or side wall parts 4*wo*) rising up from the fixing parts 4*s*, and the electrode part 4*j* connected to the side wall parts 4*w* and disposed in parallel to the major surface; wherein the electrode part 4*j* forms, together with the insulating film 3, the gap region 4*g* therebetween, and portions of the electrode part 4*j* where it is connected to the side wall parts 4*w* are in at least one of: a positional relationship in which they sandwich therebetween the central portion of the electrode part in the bonding region R5 to be bonded to the bonding wire 5; and a positional relationship in which they surround the central portion. Thus, the interval Dg of the gap region 4g can be controlled accurately and the gap region 4g can be prevented from being deformed even at the time of bonding, so that it is possible to stably reduce the parasitic capacitance.

Furthermore, when the bonding pad 4 is configured to have: the open portion 4ja created in the electrode part 4j and inside the bonding region R5; a secondary fixing part (fixing part 4si) that is a portion directed in parallel to the major surface (in a direction in the xy plane) and matched to the open portion 4ja, and that is fixed onto the insulating film 3; and a cylindrical secondary side wall part (side wall part 4wi) rising up from the secondary fixing part (fixing part 4si); wherein an inner circumference portion around the open portion 4ja is connected to the secondary side wall part (side wall part 4wi), since the cylindrical secondary side wall part (side wall part 4wi) supports the electrode part 4j from the inner circumference side, it is possible to more strongly suppress the deformation of the gap region 4g at the time of bonding.

Instead, when such a configuration is employed in which the side wall parts 4w (or side wall parts 4wo) are connected to the electrode part 4j over the entire circumference thereof and, in at least one of the electrode part 4j and the side wall parts 4w, the communication hole 4p communicated with the gap region 4p is created, since the electrode part 4j is supported by the side wall parts 4w over the entire circumference, even if a force is applied thereto from any direction, the deformation of the gap region 4g at the time of bonding can be suppressed, so that it is possible to stably reduce the parasitic capacitance.

On that occasion, when the communication hole 4p is created at a position where it is to be closed when the bonding wire 5 is bonded, the gap region 4g will be provided as a closed space and thus, even when sealing is accomplished using a resin, the resin will not intrude into the gap region 4g, so that it is possible to surely reduce the parasitic capacitance.

Further, when the bonding pad 4 is configured with a stacked structure composed of a deposition layer (power feeding layer 41) formed on its side where the surface facing the insulating film 3 is placed, and the plated layer 42 formed on the side opposite to the facing surface and onto the power feeding layer 41, it is possible to easily and accurately form the bonding pad having the gap region 4g. In addition, since, out of the layers that constitute the stacked structure, at least one layer is provided as a plated layer, the strength of the portion corresponding to the side wall part 4w is increased and thus the deformation resistance thereof is improved when that portion is set to have a thickness and a density that are equivalent to those of portions corresponding to the fixing part 4s and the electrode part 4j.

DESCRIPTION OF REFERENCE NUMERALS AND SIGNS

1: semiconductor device, 2: electrically-conductive semiconductor substrate, 3: insulating film, 4: bonding pad, 4g: gap region, 4j: electrode part, 4ja: open portion, 4p: communication hole, 4s: fixing part, 4si: (secondary) fixing part, 4so: fixing part, 4w: side wall part, 4wi: (secondary) side wall part, 4wo: side wall part, 5: bonding wire, 8: first photoresist, 9: second photoresist, 41: power feeding layer (deposition layer), 42: plated layer, Dg: interval.

The invention claimed is:

1. A semiconductor device, comprising:
an electrically-conductive semiconductor substrate with which a semiconductor circuit is formed;
an insulating film deposited on a major surface of the electrically-conductive semiconductor substrate; and
a bonding pad having fixing parts fixed onto the insulating film, side wall parts rising up from the fixing parts, and an electrode part connected to the side wall parts and disposed in parallel to the major surface;
wherein the electrode part forms, together with the insulating film, a gap region therebetween, and portions of the electrode part where it is connected to the side wall parts are in at least one of: a positional relationship in which the side wall parts sandwich therebetween a central portion of the electrode part in its bonding region to be bonded to a bonding wire; and a positional relationship in which the side wall parts surround the central portion; and
wherein the bonding pad has:
an open portion in the electrode part and inside the bonding region;
a secondary fixing part that is a portion directed in parallel to the major surface and matched to the open portion, and that is fixed onto the insulating film; and
a cylindrical secondary side wall part rising up from the secondary fixing part;
wherein an inner circumference portion around the open portion is connected to the cylindrical secondary side wall part joining the secondary fixing part to the electrode part.

2. The semiconductor device of claim 1, wherein the bonding pad is configured with a stacked structure composed of a deposition layer formed on a side of the bonding pad and having a surface facing the insulating film, and a plated layer formed on a side of the deposition layer opposite to the surface facing the insulating layer.

3. A semiconductor device, comprising:
an electrically-conductive semiconductor substrate with which a semiconductor circuit is formed;
an insulating film deposited on a major surface of the electrically-conductive semiconductor substrate; and
a bonding pad having fixing parts fixed onto the insulating film, side wall parts rising up from the fixing parts, and an electrode part connected to the side wall parts and disposed in parallel to the major surface;
wherein the electrode part forms, together with the insulating film, a gap region therebetween, and portions of the electrode part where it is connected to the side wall parts are in at least one of: a positional relationship in which the side wall parts sandwich therebetween a central portion of the electrode part in its bonding region to be bonded to a bonding wire; and a positional relationship in which the side wall parts surround the central portion; and
wherein the side wall parts are connected to the electrode part over an entire circumference thereof, and wherein, in at least one of the electrode part and the side wall parts, a communication hole communicated with the gap region is formed.

4. The semiconductor device of claim 3, wherein the communication hole is created at a position where it is to be closed when the bonding wire is bonded.

5. The semiconductor device of claim 3, wherein the bonding pad is configured with a stacked structure composed of a deposition layer formed on a side of the bonding pad and having a surface facing the insulating film, and a plated layer formed on a side of the deposition layer opposite to the surface facing the insulating layer.

6. The semiconductor device of claim 4, wherein the bonding pad is configured with a stacked structure composed of a deposition layer formed on a side of the bonding pad and having a surface facing the insulating film, and a plated layer formed on a side of the deposition layer opposite to the surface facing the insulating layer.

* * * * *